(12) United States Patent
Ju et al.

(10) Patent No.: US 6,287,476 B1
(45) Date of Patent: Sep. 11, 2001

(54) ELECTROCHEMICAL METHOD TO IMPROVE MR READER EDGE DEFINITION AND DEVICE RELIABILITY

(75) Inventors: Kochan Ju; Shou-Chen Kao, both of Fremont; Cherng-Chyi Han, San Jose; Jei-Wei Chang, Cupertino; Mao-Min Chen, San Jose, all of CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/332,429

(22) Filed: Jun. 14, 1999

(51) Int. Cl.$^7$ ................................................ G11B 5/127
(52) U.S. Cl. .................. 216/47; 216/76; 438/717; 360/313
(58) Field of Search ............................. 216/22, 47, 66, 216/76; 438/717; 205/80, 220, 223, 171; 360/313

(56) References Cited

U.S. PATENT DOCUMENTS

| Re. 34,099 | 10/1992 | Krounbi et al. ................ 360/113 |
|---|---|---|
| 4,782,414 | 11/1988 | Krounbi et al. ................ 360/113 |
| 5,256,249 | 10/1993 | Hsie et al. ...................... 156/656 |
| 5,491,600 | 2/1996 | Chen et al. ...................... 360/113 |
| 5,568,335 | 10/1996 | Fontanna et al. .............. 360/113 |
| 5,595,637 * | 1/1997 | Tench et al. ..................... 205/91 |
| 5,634,260 * | 6/1997 | Nix et al. ...................... 29/603.14 |
| 5,658,469 | 8/1997 | Jennison ........................... 216/22 |
| 5,747,198 | 5/1998 | Kamijima ........................... 430/11 |
| 5,753,131 * | 5/1998 | Choukh et al. .................. 216/22 |
| 5,843,521 * | 12/1998 | Ju et al. ........................... 427/129 |
| 6,007,731 * | 12/1999 | Han et al. ........................ 216/22 |
| 6,103,073 * | 7/2000 | Thayamballi ................ 204/192.2 |
| 6,181,532 * | 1/2001 | Dovek et al. .................... 360/321 |

* cited by examiner

Primary Examiner—Randy Gulakowski
Assistant Examiner—Jiri Smetana
(74) Attorney, Agent, or Firm—George O. Saile; Stephen B. Ackerman; William J. Stoffel

(57) ABSTRACT

A method to form a passivation layer using an electrochemical process over a MR Sensor so that the passivation layer defines the MR track width. The passivation layer is formed by anodizing the MR sensor. The passivation layer is an electrical insulator (preventing Sensor current (I) from shunting through the overspray) and a heat conductor to allow MR heat to dissipate away from the MR sensor through the overspray. The method comprises: forming a passivation layer on the MR sensor; the passivation layer formed using an electrochemical process. Then we spinning-on and printing a lift-off photoresist structure over the passivation layer. The passivation layer is etched to remove the passivation layer not covered by the lift-off structure thereby defining a track width of the MR sensor. Then we deposit a lead layer over the passivation layer and MR sensor. The lift-off structure is removed where by the passivation layer defines a track width. The passivation layer is an electrical insulator that prevents sensor current (I) form shunting through overspray layers while allowing heat to dissipate through to the lead layer.

17 Claims, 2 Drawing Sheets

ELECTROCHEMICAL METHOD TO IMPROVE MR READER EDGE DEFINITION AND DEVICE RELIABILITY

BACKGROUND OF INVENTION

1) Field of the Invention

This invention relates generally to fabrication of bit lines and more particularly to the fabrication of a Magnetoresistive head (MR) for a Magnetic disk drive and more particularly to a method for forming a passivation layer over a MR sensor layer and metal overspray on top of the passivation layer to reduce temperature.

2) Description of the Prior Art

The prior art discloses a magnetic transducer referred to as a magnetoresistive (MR) sensor or head which has been shown to be capable of reading data from a magnetic surface at great linear densities. A MR sensor detects magnetic field signals through the resistance changes of a read element made from a magnetoresistive material as a function of the amount and direction of magnetic flux being sensed by the element.

Current MR heads are manufactured by using a lift-off process to deposit lead layers and define reader track. See e.g., U.S. Pat. No. 5,658,469 (Jennison) that shows a lift-off method for improving the photoresist lift-off block shape.

Numerous prior art MR sensors have been developed, and these prior art MR sensors have been effective to meet prior art requirements. However, the drive toward increased recording density has led to the requirement for narrower recording tracks and increased linear recording density along the track. The small MR sensors which are necessary to meet these requirements cannot be made with the use of the prior art techniques.

The importance of overcoming the various deficiencies noted above is evidenced by the extensive technological development directed to the subject, as documented by the relevant patent and technical literature. The closest and apparently more relevant technical developments in the patent literature can be gleaned by considering RE34,099 (Krounbi et al.) and U.S. Pat. No. 4,782,414 (Krounbi) that show an thick insulating layer 22 over a MR sensor.

U.S. Pat. No. 5,658,469 (Jennison) shows a method for improving the photoresist lift-off block shape to form a consistent undercut.

U.S. Pat. No. 5,256,249 (Hsie et al.) discloses a method for forming a MR sensor having a track wide oxide layer overlying the MR sensor.

U.S. Pat. No. 5,668,335 (Fontana et al.), U.S. Pat. No. 5,491,600 (Chen et al.) and U.S. Pat. No. 5,747,198 (Kamijima) show a photoresist lift-off processes to form MR heads.

However, an improved method to remove heat 40 from a MR sensor and accurately defining the MR stripe width is still needed.

SUMMARY OF THE INVENTION

It is an object of the present invention to provide a method to form a passivation layer over a MR Sensor so that the passivation layer defines the track width.

It is an object of the present invention to provide a method to form a passivation layer over a MR Sensor so that the passivation layer is formed by an anodizing process before the development of the lift off structure.

It is an object of the present invention to provide a method to form a passivation layer over a MR Sensor so that the passivation layer is an electrical insulator (prevents sensor current from shunting through the overspray portion of the lead and a heat conductor to allow MR heat to dissipate through the overspray and lead.

To accomplish the above objectives, the present invention provides a method to form a passivation layer over a MR Sensor so that the passivation layer defines the track width. An important feature of the invention is that the passivation layer is formed by an electrochemical (e.g., anodizing) process prior to the development of the lift off structure. The passivation layer is an electrical insulator (prevents the Sensor current from shunting through the overspray and a heat conductor to allow MR heat to dissipate through the overspray.

A method to form a passivation layer using an electrochemical process over a MR Sensor so that the passivation layer defines the MR track width. The passivation layer is preferably formed by anodizing the MR sensor. The passivation layer is an electrical insulator (preventing Sensor current (I) from shunting through the overspray) and a heat conductor to allow MR heat to dissipate away from the M sensor through the overspray.

The method comprises: forming a passivation layer on the MR sensor; the passivation layer formed using an electrochemical process. Then we spinning-on and printing a lift-off photoresist structure over the passivation layer. The passivation layer is etched to remove the passivation layer not covered by the lift-off structure thereby defining a track width of the MR sensor. Then we deposit a lead layer over the passivation layer and M sensor. The lift-off structure is removed where by the passivation layer defines a track width. The passivation layer is an electrical insulator that prevents sensor current (I) form shunting through overspray layers while allowing heat to dissipate through to the lead layer.

The present invention achieves these benefits in the context of known process technology. However, a further understanding of the nature and advantages of the present invention may be realized by reference to the latter portions of the specification and attached drawings.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a MR device according to the present invention and further details of a process of fabricating such a MR device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
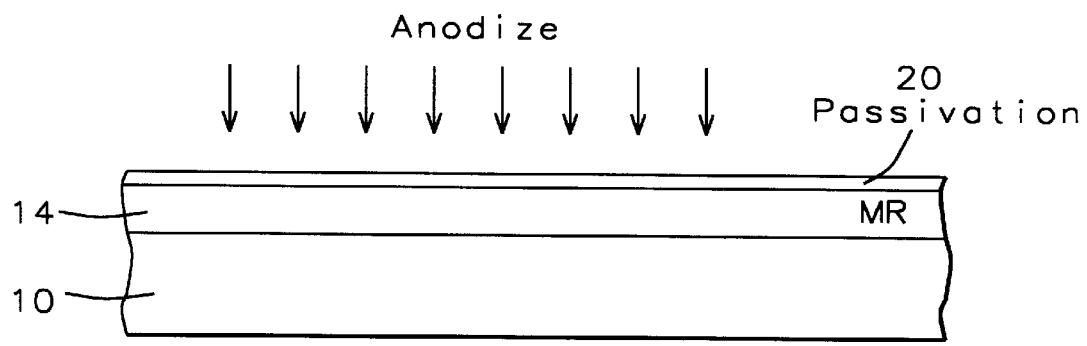
FIG. 1 is a cross sectional view of a MR substrate, MR sensor 14 and passivation layer 20 (preferably formed by an anodization process) according to the method of the present invention.

A. Problem the Invention Solves—Heat Dissipation 40 from MR Sensor 14

MR heads are manufactured by using a lift-off process to deposit lead layers and define reader track. In this process, a patterned double photo-sensitive layer structure is built on top to the sensor layer. By selectively photo-developing, the edge of the bottom photo-sensitive layer can be dissolved and formed an undercut structure. When stabilization (exchange layer) and lead layers are physically deposited, the overhang of the top photo-sensitive will block deposition and define the MR reader edge. Unfortunately, the overspray 30A (of the lead layers 30) under the photoresist overhang will cause poor edge definition and product inconsistency. With a decrease in recording track width, the length of overspray (of lead and exchange layers) becomes a fairly large portion of track width and significantly impacts head performance.

One approach to reduce the thickness of bottom layer of photoresist in the lift-off structure thus eliminating the overspray from the lead/exchange layers. However, the inventors have found that the elimination of the overspray 30A (on the MR) reduces heat dispersion from the edges of the MR sensor. When the MR current increases, heat generated by the MR sensor damages the edge portions of the sensor. The inventor(s) discovery of the heat damage of the MR sensor because of inadequate heat dissipation was a key step towards the invention.

A key feature of the invention is that the thin passivation layer 20 allows heat to dissipate through lead layers 30 30A over the MR sensor 14, but still accurately define the MR edges 16.

The invention is a method of fabricating a passivation layer 20 using anodization process over a MR Sensor 14. See FIG. 4.

B. Overview

The present invention provides a method to form a passivation layer 20 over a MR Sensor 14 so that the passivation layer defines the track width 16. An important feature of the invention is that the passivation layer 20 is formed by an electrochemical (e.g., anodizing) process prior to the development of the lift off structure 24A 24B. The passivation layer 20 is an electrical insulator (prevents the Sensor current 42 from shunting through the overspray 30A) and a heat conductor to allow MR heat to dissipate through the overspray 30A. See FIG. 4.

A preferred embodiment comprises:

forming a passivation layer 20 on the MR sensor 14; the passivation layer formed using an electrochemical process.

Then we spinning-on and printing a lift-off photoresist structure 24A 24B over the passivation layer 20.

The passivation layer is etched to remove the passivation layer 20 not covered by the lift-off structure 24A 24B thereby defining a track width 16 of the MR sensor.

Then we deposit a lead layer 30 over the passivation layer 20 and MR sensor 14.

The lift-off structure 24A 24B is removed where by the passivation layer 20 defines a track width 16.

The passivation layer 20 is an electrical insulator that prevents sensor current (I) form shunting through overspray layers 30A while allowing heat to dissipate through to the lead layer 30.

C. MR Sensor

As shown in FIG. 1, the invention begins depositing a MR sensor 14 over a substrate 10. It is understood that the substrate can comprise insulating and magnetic or non-magnetic layers is not limited. The MR sensor 14 can be composed of Permalloy (NiFe), or NiFeO and is most preferably composed of NiFe. The MR sensor can be formed of any magnetoresistive (MR) materials that can be oxidized by an electroplating process or galvanic process. The MR sensor can be a multi-layered structure and can be a soft adjacent layer (SAL) MR, dual stripe magnetoresistive (DSMR), single stripe magnetoresistive (SSMR), giant magnetoresistance (GMR).

D. Anodizing the MR Sensor to Form a Passivation Layer 20

Next, a passivation layer 20 is formed over the MR sensor 20. The passivation layer can be formed using any of the following processes: electro-deposition, thermal oxidation or chemical passivation. An important property of the passivation layer 20 is that it is an electrical insulator*(or high resistance layer), but a heat conductor (e.g., because it's thin). The passivation layer can be composed of Ni, NiCr, $Ni(OH)_2$, $Cr_2O$, NiO, NiFeO, or metal hydroxide or metal oxides and is most preferably composed of NiFeO.

The passivation layer preferably has a thickness of between about 20 and 100 Å (tgt=50 Å).

E. Preferred Process—Anodizing the MR Sensor to Form a Passivation Layer 20

A major feature of the invention is the electrochemical process to form the passivation layer 20. The invention's electrochemical process allows a thin layer that allows heat 40 to be conducted away from the MR sensor. Preferably, the passivation layer is formed using a electrochemical process as opposed to a deposition or sputtering process.

In a preferred process, the MR sensor is anodized in an alkaline solution composed of phosphate, borate, carbonate or acetate at an applied voltage of 1.2 V for between about 0.1 and 5 min (tgt=1 min) to from a thin passivation layer 20. The passivation layer is preferably composed of NiFeO, NiO, CrO, metal oxides or Metal hydroxides and most preferably NiFeO.

The passivation layer is preferably formed by anodizing said MR sensor in an alkaline electrolyte solution having a pH between about 8 and 12, and applying a voltage to said MR sensor between 0.1 and 1.5 V and a current between about 0.1 and 100.0 $mA/Cm^2$, (galvanic) for a time between 30 and 90 seconds.

TABLE preferred passivation process and composition of passivation solution

| Process- | units | Low | tgt | hi |
|---|---|---|---|---|
| Composition of passivation solution | | | | |
| Ammonium persulfate | | 0.3 M | 0.455 M | 0.6 |
| Time | MIN | 0.1 | 0.5 | 20 |
| pH | | 7 | 10 | 11 |
| temperature | °C. | 0 | 25 | 50 |

NiFeO passivation layers 20 can be formed in a electrolyte with a pH between 8 to 12. Also, NiFe-anodizing can be carried out galvanically (0.1 to 100 mA/Cm$^2$) or potentially (0 to 2V). The thickness of the passivation layer 20 can be controlled by varying the anodic current and process time. Anodic currents can be pulsed.

It is important to understand that the passivation layer 20 is both an electrical insulator and thin enough allow heat 40 to effectively dissipate through away from the MR sensor 14. It is an important understanding that the invention had that an extremely thin passivation layer can effectively electrically insulate the MR 14 from the lead lines 30. In contrast, the prior art forms thick insulating layers over the MR, but this insulating layers are not good heat conductors because of the dielectric materials they are formed of and because of their required thickness to ensue adequate electrical insulation from the Lead 30 to the M sensor 14.

F. Spinning—on and Printing a Lift-off Photoresist Structure 24A 24B

Figure 2:
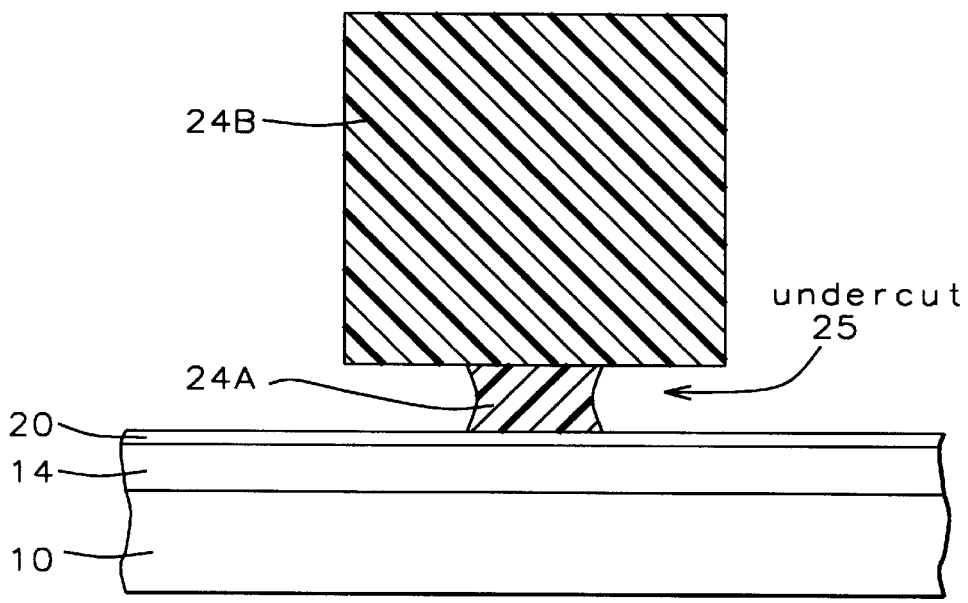
FIG. 2 is a cross sectional view of a MR substrate, MR sensor 14 and passivation layer 20 and lift-off structure 24A 24B showing the developing of the lower photoresist layer 24A according to the method of the present invention.

Referring to FIG. 2, the next step comprises spinning-on and printing a lift-off photoresist structure 24A 24B over the MR sensor 14. The lift off photoresist structure is preferably comprised of a lower photoresist layer 24A (e.g., pedestal layer) and an upper photoresist layer 24B (e.g., capping layer). The lower photoresist layer has different sensitivities to developer solutions than the upper photoresist layer 24B.

The lower photoresist layer 24A is preferably composed of PMG1. The upper photoresist layer is preferably composed of Novolak resist.

G. Developing Step Forms the Lift-off Photoresist Structure 24A 24B

The developing step forms the lift-off photoresist structure 24A 24B in a developing solution to remove portions of the lower photoresist 24A.

The developing solution preferably contains: developing chemicals to develop the lift-off photoresist structure (preferably KOH, NaOH or MIF (metal ion free such as TMAH).

The developing speed of the lower photoresist layer 24A to produce an undercut 25 can be varied with pH and process temperature and the thickness of the passivation layer 20 can be controlled by the strength of passivation agent and temperature.

The lift-off structure 24A 24B is preferably immersed in a AZ400K (1:4) solution containing 0.5M ammonium persulfate or other oxidation agents at room temperature.

The remaining lower photoresist layer 24A preferably has a thickness of between about 1000 and 10,000 Å and a width of between about 0.2 and 1.5 $\mu$m. The upper photoresist layer 24B preferably has a thickness of between about 1000 and 40,000 Å, and width between about 0.5 and 2.5 $\mu$m. Therefore, the undercut 25 preferably has a width between about 0.15 and 0.5 $\mu$m.

H. Etching the Passivation Layer 20

Figure 3:
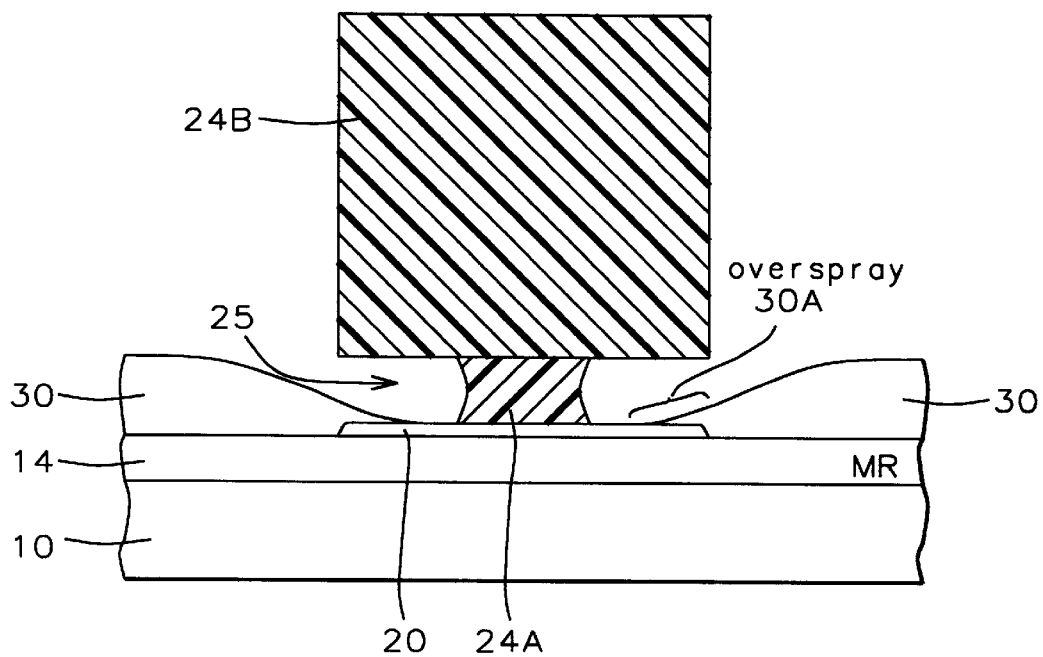
FIG. 3 is a cross sectional view of a MR substrate and MR sensor and lift-off structure 24A 24B showing the (1) etching of the passivation layer 20 to define the track width 16 and (2) the deposition of the lead layer 30 according to the method of the present invention.

FIG. 3 shows the step of etching the passivation layer 20 to remove the passivation layer 20 not covered by the lift-off structure 24A 24B. The etching is preferably ion-beam etching and the ions beam etching also redeposites in the undercut 25 (under overhang of the upper photoresist layer 24B) to increase the thickness of the (NiFe) passivation 20 thickness. The ion beam etching is preferably performed at an angle between 5 to 25 degrees.

The etching of the passivation layer 20 can also be performed by sputter etching.

I. Deposit a Lead Layer 30

FIG. 3 also shows the depositing of a conductive lead layer 30 over the passivation layer 20 and MR sensor 14. The lead layer 30 can comprise multiple layers such as stabilizing, pinning layers and/or conductive lead layers, as is well known in the art. The lead layer can be formed of various layers of conductive metals. The lead layer 30 is preferably composed of Au and preferably has a thickness of between about 250 and 1000 Å.

The geometry of the lead layer 30 is not important as long as the leads are not shorted across the MR. Note that the passivation layer 20 defines the read track width 16 and the overspray 20A of the lead layer 30 does not define the read track width 16.

The overspray 30A portion of the lead layer 30 preferably has a width in a range of between about 0.15 and 0.5$\mu$m.

J. Removing the Lift-off Structure 24A 24B

Figure 4:
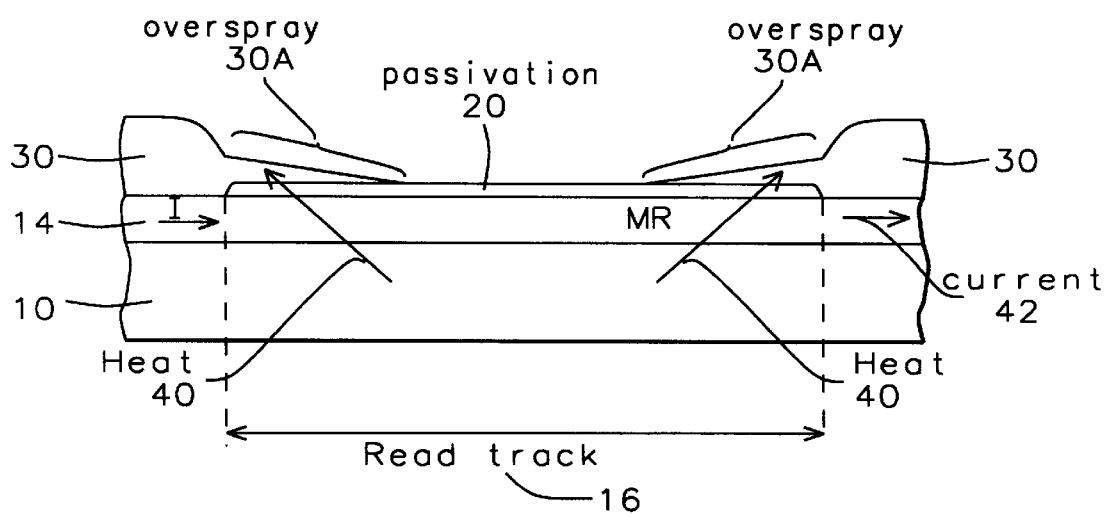
FIG. 4 is a cross sectional view of a MR substrate and MR sensor and lead layers 30 showing the heat dissipation through the passivating layer 30 and blocking of the sense current (I) by the passivation layer to prevent shunting according to the method of the present invention.

Referring to FIG. 4, removing the lift-off structure 24A 24B. Thus the passivation layer 20 defines a track width 16. The passivation layer 20 is an electrical insulator that prevents sensor current (I) form shunting through overspray layers 30A (tapered edges of the lead layer 30) while allowing heat 40 to dissipate through to the lead layer 30.

K. Advantages of the Invention

FIG. 4 shows 2 key advantages of the invention. (1) The passivation layer 20 prevents shunting of the MR current (I) through the metal overspray 30A portion of the lead 30. Because of electrical blockage by this high-resistivity passivation layer 20 between MR 14 and "overspray" 30A portion of the lead 30, the MR sensor current (I) 42 will not be shunted by the "overspray" 30A. Thus the read track width 16 is defined by the passivation layer 20 that is etched by the ion beam (see FIG. 3).

(2) The passivation layer 20 allows heat to dissipate through to the overlying overspray 30A and lead layers 30. The metal overspray 30A is a heat conducting channel to disperse sensor heat and improve reliability.

L. Possible Applications of the Invention

The invention can be applied to many structures such as soft adjacent layer (SAL) (biasing of the MR sensor) MR, single stripe magnetoresistive (SSMR), dual stripe magnetoresistive (DSMR) and giant magnetoresistance (GMR) heads. For a dual stripe magnetoresistive (DSMR), the process of the invention can be performed on each MR strip to define the read track width for each MR stripe.

It should be recognized that many publications describe the details of common techniques used in the fabrication process of integrated circuit components. Those techniques can be generally employed in the fabrication of the structure of the present invention. Moreover, the individual steps of such a process can be performed using commercially available MR fabrication machines. As specifically necessary to an understanding of the present invention, exemplary technical data are set forth based upon current technology. Future developments in the art may call for appropriate adjustments as would be obvious to one skilled in the art.

The present invention is described in detail with reference to the accompanying drawings. In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a passivation layer over a MR Sensor; comprising the steps of:
   a) depositing an MR sensor over a substrate;
   b) forming a passivation layer on said MR sensor; said passivation layer formed using an electrochemical process;
   c) spinning -on and printing a lift-off photoresist structure over said passivation layer; said lift off photoresist structure comprised of a lower photoresist layer and an upper photoresist layer;
   d) developing said lift-off photoresist structure and remove portions of said lower photoresist layer;
   e) etching said passivation layer to remove said passivation layer not covered by said lift-off structure;
   f) depositing a lead layer over said passivation layer and MR sensor;
   g) removing said lift-off structure; where by said passivation layer defines a track width; said passivation layer is an electrical insulator that prevents sensor current form shunting through overspray layers while allowing heat to dissipate through to said lead layer.

2. The method of claim 1 wherein said passivation layer is composed of a material selected from the group consisting of NiFeO, NiO, Ni(OH)$_2$, Cr$_2$O, metal hydroxides and metal oxides.

3. The method of claim 1 wherein said passivation layer is composed of NiFeO.

4. The method of claim 1 wherein said MR sensor is composed of permalloy.

5. The method of claim 1 wherein said passivation layer has a thickness of between about 20 and 100 Å.

6. The method of claim 1 where in said MR sensor is a sensor type selected from the group consisting of giant magnetoresistance (GMR), Spin valve, dual stripe magnetoresistive (DSMR), and single stripe magnetoresistive (SSMR).

7. The method of claim 1 wherein said passivation layer formed by anodizing said MR sensor in an alkaline electrolyte solution having a pH between about 8 and 12, and applying a voltage to said MR sensor between 0.1 and 1.5 V and a current between about 0.1 and 10.0 mA/Cm$^2$, for a time between 30 and 90 seconds.

8. The method of claim 1 wherein said lead layer comprises stabilizing and pinning layers.

9. The method of claim 1 wherein the developing speed of the lower photoresist layer to produce an undercut is controlled with pH and process temperature.

10. The method of claim 1 wherein the developing in step (d) said lift-off structure is preferably immersed in a solution containing between 0.3 and 0.6 M ammonium persulfate.

11. A method of fabricating a passivation layer over a MR Sensor; comprising the steps of:
    a) deposit an MR sensor over a substrate; said MR sensor comprised of Permalloy;
    b) forming a passivation layer on said MR sensor; said passivation layer formed using an electrochemical process; said passivation layer is composed of a material selected from the group consisting of NiO, NiFeO, and Ni(OH)$_2$; said passivation layer formed by anodizing said MR sensor in an alkaline electrolyte solution having a pH between about 8 and 12, and applying a voltage to said MR sensor between 1.0 and 1.5 V and a current between about 0.1 and 10.0 mA/Cm$^2$, for a time between 30 and 90 seconds;
    c) spinning-on and printing a lift-off photoresist structure over said passivation layer; said lift off photoresist structure comprised of a lower photoresist layer and an upper photoresist layer;
    d) developing said lift-off photoresist structure remove portions of said lower photoresist;
    e) etching said passivation layer to remove said passivation layer not covered by said lift-off structure;
    f) depositing a lead layer over said passivation layer and MR sensor;
    g) removing said lift-off structure; whereby said passivation layer defines a track width; said passivation layer is an electrical insulator that prevents sensor current (I) form shunting through overspray layers while allowing heat to dissipate through to said lead layer.

12. The method of claim 11 wherein said passivation layer is composed of NiFeO.

13. The method of claim 11 wherein said passivation layer has a thickness of between about 20 and 100 Å.

14. The method of claim 11 wherein the developing in step (d) said lift-off structure is preferably immersed in a solution containing between 0.3 and 0.6 M ammonium persulfate.

15. The method of claim 11 wherein said MR sensor is a sensor type selected from the group consisting of giant magnetoresistance (GMR), Spin valve, dual stripe magnetoresistive (DSMR), and single stripe magnetoresistive (SSMR).

16. The method of claim 11 wherein said lead layer comprises stabilizing, pinning and conducive layers.

17. A method of fabricating a passivation layer over a MR Sensor; comprising the steps of:
    a) depositing an MR sensor over a substrate;
    b) forming a passivation layer on said MR sensor; said passivation layer formed using an electrochemical process; said passivation layer is comprised of a material selected from the group consisting of NiFeO, NiO, Ni(OH)$_2$, Cr$_2$O, metal hydroxides and metal oxides;
    c) spinning-on and printing a lift-off photoresist structure over said passivation layer; said lift off photoresist structure comprised of a lower photoresist layer and an upper photoresist layer;
    d) developing said lift-off photoresist structure and remove portions of said lower photoresist layer;
    e) etching said passivation layer to remove said passivation layer not covered by said lift-off structure;
    f) depositing a lead layer over said passivation layer and MR sensor; and
    g) removing said lift-off structure; whereby said passivation layer defines a track width; said passivation layer is an electrical insulator that prevents sensor current form shunting through overspray layers while allowing heat to dissipate through to said lead layer.

* * * * *